United States Patent [19]

Knibbeler

[11] Patent Number: 4,888,809
[45] Date of Patent: Dec. 19, 1989

[54] METHOD OF AND ARRANGEMENT FOR ADJUSTING THE TRANSFER CHARACTERISTIC TO TWO LISTENING POSITION IN A SPACE

[75] Inventor: Charles L. C. M. Knibbeler, Eindhoven, Netherlands

[73] Assignee: U.S. Philips Corporation, New York, N.Y.

[21] Appl. No.: 239,573

[22] Filed: Sep. 1, 1988

[30] Foreign Application Priority Data

Sep. 16, 1987 [NL] Netherlands ............ 8702200

[51] Int. Cl.$^4$ .............................................. H03G 5/00
[52] U.S. Cl. ...................................... 381/103; 381/24
[58] Field of Search ................ 381/96, 103, 86, 24, 381/98

[56] References Cited

U.S. PATENT DOCUMENTS

| | | | |
|---|---|---|---|
| 4,628,530 | 12/1986 | Op De Beer | 381/103 |
| 4,638,506 | 1/1987 | Han | 381/63 |
| 4,739,513 | 4/1988 | Kunungi et al. | 381/96 |

Primary Examiner—Forester W. Isen
Attorney, Agent, or Firm—Algy Tamoshunas; Marianne R. Rich

[57] ABSTRACT

In the method of adjusting the transmission of an electric signal, applied to an input terminal ($1, 1'$), via two transducer devices ($8, 9$), to an acoustic signal at two positions ($P_1, P_2$) in a space ($10$), (a) the levels of the electric signals applied to the two transducer devices are adjusted in such a way that the two transducer devices provide substantially equal contributions to the acoustic signal at the first position ($P_1$), (b) the second filter unit ($4$) is adjusted so as to obtain a desired frequency-response characteristic ($50$, FIG. 5) for the transmission from the input terminal ($1, 1'$) to the second listening position ($P_2$), (c) the first filter unit ($3$) is adjusted so as to obtain a desired frequency-response characteristic ($50$, FIG. 5) for the transmission from the input terminal ($1, 1'$) to the first listening position ($P_1$). Also described are an arrangement for carrying out the method (FIG. 1) and an arrangement for amplifying an electric signal adjusted on the basis of the measurement results obtained in accordance with the method (FIG. 3).

12 Claims, 4 Drawing Sheets

METHOD OF AND ARRANGEMENT FOR ADJUSTING THE TRANSFER CHARACTERISTIC TO TWO LISTENING POSITION IN A SPACE

The invention relates to a method of adjusting the frequency-response characteristic of the transmission of an electric signal which is applied to an input terminal of an amplifier unit and which is converted to an acoustic signal at at least one listening position in a space via two electro-acoustic transducer devices, the electric signal being applied, via the input terminal, to a first and a second filter unit belonging to the amplifier unit and having an output coupled to the first and the second transducer device respectively, and also relates to an arrangement for carrying out the method and to an arrangement for amplifying an electric signal, comprising a first and a second filter unit adjusted in response to the measurement results obtained by means of the method. The method of the type defined above is known from European Patent Application No. 165,733 which has been laid open to public inspection and which relates to an equalizing method for use in a car. Although the invention is not limited to automotive use, the description is mainly based on the use of the invention in a car. Moreover, as will become apparent hereinafter, the invention is not limited to the mere equalization of a frequency-response characteristic, but is more generally intended for adjusting a frequency-response characteristic so as to obtain a desired (not necessarily flat) frequency-response characteristic.

In the known method and the known arrangement an electric signal in the form of a stereo signal is applied to two electro-acoustic transducer devices. One transducer device (for example the first one) comprises two loudspeakers arranged at the front left and front right in the passenger compartment of the car to reproduce the left-hand and right-hand signal components of the stereo signal. The other transducer device (for example the second one) also comprises two loudspeakers arranged at the rear left and rear right in the passenger compartment, also for reproducing the stereo signal.

The known method provides equalization for one listening position. At the listening positions detection means are placed in the form of two microphones arranged in a artificial head, which microphones measure the acoustic signal at this listening position, convert this acoustic signal into an electric signal which is a measure of the acoustic signal detected at this listening position, and feed it to an output coupled to an input of a control unit. Under the influence of this signal the control unit supplies a control signal to two filter units in the form of equalizers, which are each coupled between the input terminal of the arrangement and one of the two transducer devices. Under the influence of the control signal the two equalizers are adjusted in such a way that a substantially flat frequency-response characteristic is obtained for the transmission of the electric signal at the input terminal to the acoustic signal at the listening position.

It is the object of the invention to provide a method of and device for carrying out the method, enabling a desired frequency-response characteristic for the transmission to at least two non-coincident listening positions in the space to be obtained. In particular, it may provide equalization for these two listening positions.

To this end the method in accordance with the invention is characterized in that (a) the levels of the electric signals applied to the first and the second transducer device are adjusted in such a way that the acoustic signals delivered by the first and the second transducer device provide substantially equal contributions to the acoustic signal at the location of the first listening position; (b) the second filter unit is adjusted so as to obtain a desired frequency-response characteristic for the transmission of the electric signal, applied to the input terminal, to the acoustic signal at the second listening position; (c) the first filter unit is adjusted in such a way that in the presence of an electric signal, applied to the second transducer device a desired frequency-response characteristic is obtained for the transmission of the electric signal, applied to the input terminal, to the acoustic signal at the first listening position, in that the first and the second listening position are situated at least substantially between the first and the second transducer device in the space, and in that the distance between the first transducer device and the first listening position is smaller that the distance between the first transducer device and the second listening position, and vice versa. The method is very suitable for equalizing two listening positions, for example, in the passenger compartment of a car and in that case it is characterized in that in the steps (b) and (c) the second filter unit and first filter unit respectively are adjusted so as to obtain a substantially flat frequency-response characteristic for the transmission of the electric signal, applied to the input terminal, to the acoustic signal at the second and the first listening position respectively. The first listening position is for example the front position and the second listening position is then the rear position in the passenger compartment. In that case the first transducer device comprises the two front loudspeakers and the second transducer device comprises the two rear loudspeakers.

The invention is based on the recognition of the following facts. After the contributions of the first and the second transducer devices to the acoustic signal at the first listening position have been equalized in step (a), this means in fact that the level of the electric signal applied to the first transducer device will be lower than the level of the electric signal applied to the second transducer device. This is because the first listening position is situated closer to the first than to the second transducer device. As a result of this, the acoustic signal at the second listening position is mainly determined by the acoustic signal delivered by the second transducer device. In step (b) this enables the frequency-response characteristic of the transmission of the electric signal, at the input terminal to the acoustic signal at the second listening position to be adjusted in conformity with a desired curve, for example to be equalized, by means of the second filter unit. It is irrelevant whether this is effected when the first transducer device is operative or inoperative.

Adjusting the transmission between the electric signal at the input terminal and the acoustic signal at the location of the first listening position is subsequently effected in step (c) by adjusting the first filter unit. Since the acoustic signal at the first listening position is determined inter alia by the acoustic contribution provided by the second transducer device, this second transducer device must be operative during step (c) of the method.

The method may be characterized further in that in step (a) the level of the electric signal which, via the associated transducer device, provides the larger contribution to the acoustic signal at the location of the first listening position is reduced until the contributions to the acoustic signal at the first listening position by the acoustic signals delivered by the first and the second transducer device are substantially equal to one another. This ensures that a manually preset level (selected by the driver) which is acceptable for both listening positions is not exceeded after step (a) has been carried out, so that this cannot start the persons in the space.

Changes in conditions affecting the acoustic characteristics of the space (for example a passenger gets out of the car) and a change in balance between the left-hand and the right-hand signal component of the stereo signal influence the transmission from the input terminal to the two listening positions. In order to restore the desired frequency-response characteristics in such a case the steps (a), (b) and (c) should therefore be repeated at least once. This repeating of the method can be effected for example automatically after a control unit in the arrangement for carrying out the method has detected a (manual) change of the balance setting. If, moreover, during repetition of step (b) the first transducer device is operative, a kind of iteration can be realized by repeatedly carrying out the method, leading to an optimum setting of the filter units.

An arrangement for carrying out the method, comprising:
- an input terminal for receiving an electric signal;
- an amplifier unit having an input coupled to the input terminal, a first and a second output, a first and a second filter unit coupled between the input and the first and the second output respectively, and a control-signal input for receiving a control signal;
- a first and a second transducer device respectively coupled to the first and the second output of the amplifier unit;
- detection means for detecting an acoustic signal at the listening position in the space, for generating an electric signal which is a measure of the acoustic signal detected at said position, and for applying said electric signal to an output;
- a control unit comprising a frequency-analyser unit, having an input coupled to the output of the detection means, and an output for supplying the control signal, which output is coupled to the control-signal input of the amplifier unit, is characterized in that the detection means are further adapted to detect an acoustic signal at the second listening position in the space, to generate an electric signal which is a measure of the acoustic signal detected at said second position, and to apply said electric signal to an output, which output is coupled to an input of the control unit, in that the control unit is adapted:

(a) to adjust the levels of the electric signals applied to the first and the second transducer device by the amplifier unit in such a way that the acoustic signals supplied by the first and the second transducer device provide substantially equal contributions to the acoustic signal at the location of the first listening position and detected by the detection means;

(b) to adjust the second filter unit so as to obtain a desired frequency-response characteristic for the transmission of the electric signal, applied to the input terminal, to the acoustic signal detected by the detection means at the second listening position;

(c) to adjust the first filter unit, while the second transducer device is operative, so as to obtain a desired frequency-response characteristic for the transmission of the electric signal, applied to the input terminal, to the acoustic signal detected by the detection means at the first listening position. This arrangement enables the transfer characteristics to two listening positions in a space to be adjusted, for example to be equalized.

The detection means may comprise two microphone devices, one for each of the two position, or one microphone device which means that this device has to be transferred continually between the first and the second listening position. If the transfer characteristics to two listening positions in a car are to be adjusted (equalized), the method may be carried out once (for example at the car factory), after which the setting of the two filter units may be adapted as standard in a car radio.

Such a car radio then includes an arrangement which comprises:
an input terminal for receiving the electric signal,
an amplifier unit having an input coupled to the input terminal, a first and a second output, and a first and a second filter unit coupled between the input and the first and the second output respectively, to which first and second output a first and a second electro-acoustic transducer device can be connected, and which is characterized in that the two filter units are adjusted in such a way that, if the two transducer devices are connected to the two outputs and the arrangement with the transducer devices is arranged in a space, a desired frequency response characteristic is obtained for the transmission between the electric signal at the input terminal and the acoustic signal at a first listening position in the space and the transmission between the electric signal at the input terminal and the acoustic signal at the second listening position in the space, which second position does not coincide with the first position, in that the first and the second listening position in the space are situated at least substantially between the first and the second transducer device, and in that the distance between the first transducer device and the first listening position is smaller than the distance between the first transducer device and the second listening position, and vice versa.

Embodiments of the invention will now be described in more detail, by way of example, with reference to the accompanying drawings. In the drawings.

Figure 1:
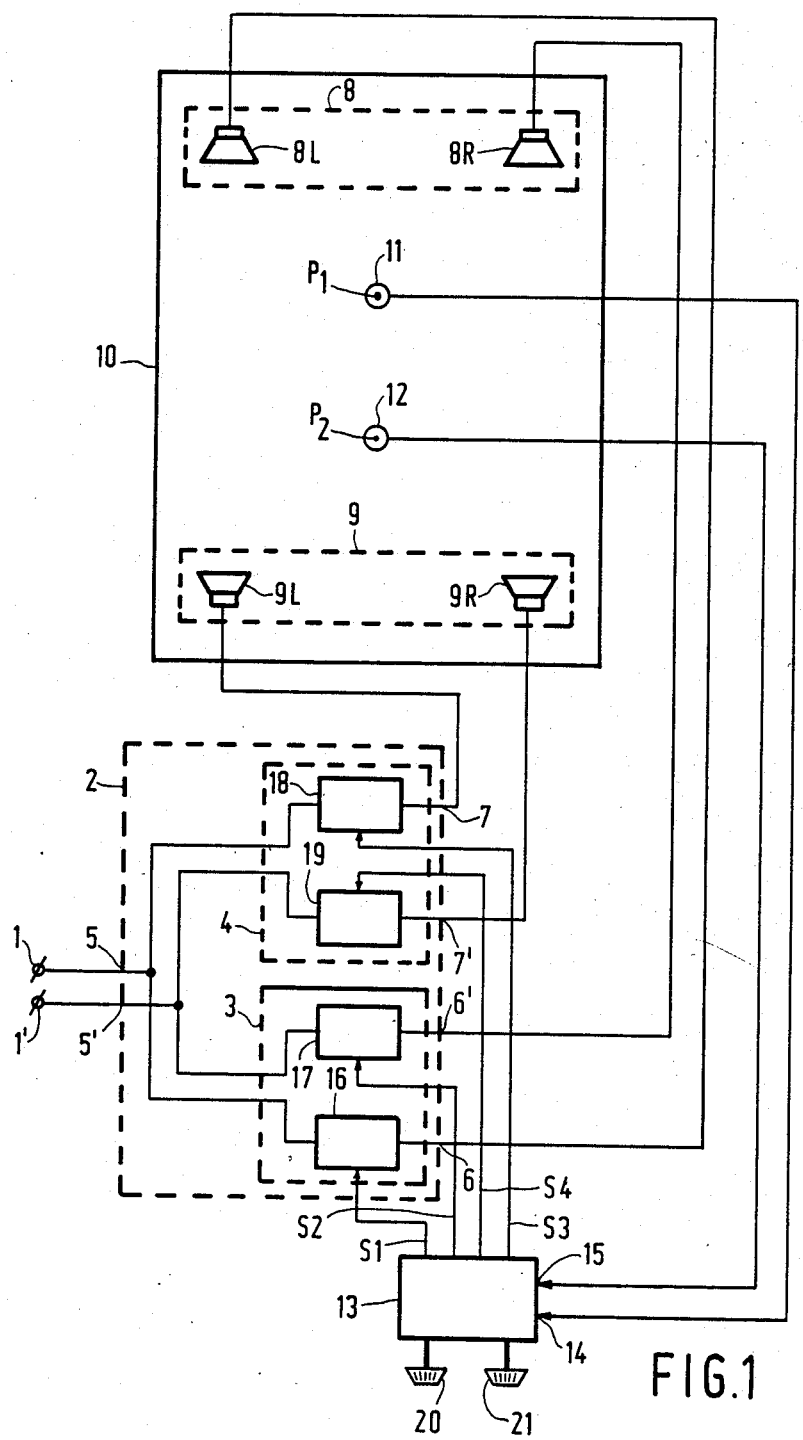
FIG. 1 shows an arrangement for carrying out the method.

FIG. 1 shows an arrangement for carrying out the method in accordance with the invention. The present arrangement serves for equalizing the transmissions to two listening positions P1 and P2 in a space 10. The arrangement comprises an input terminal 1-1' for receiving an electric signal. This signal is an electric stereo signal whose left-hand signal component is applied to the terminal 1 and whose right-hand signal component is applied to the terminal 1' of the input terminals 1-1'. The arrangement further comprises an amplifier unit in the form of an equalizing unit 2 comprising a first and a second filter unit (equalizer) 3 and 4 respectively. The equalizers 3 and 4 are coupled between an input 5-5' and a first output 6-6' and a second output 7-7' respectively of the equalizing unit 2. The first output 6-6' is coupled to a first transducer device 8. The second output 7-7' is coupled to a second transducer device 9. The two transducer devices 8 and 9 are arranged in the space 10. The space 10 is, for example, the passenger compartment of a car, the transducer device 8 being arranged at the front of the passenger compartment and the transducer device 9 at the rear of the passenger compartment, for example on the rear-deck panel. The transducer devices 8 and 9 each comprise two loudspeakers 8L, 8R and 9L, 9R respectively, for converting the electric stereo signal applied to the transducer devices into an acoustic stereo signal.

For equalizing the two listening positions $P_1$ and $P_2$ in the space the arrangement further comprises detection means 11, 12 and a control unit 13. The detection means are adapted to detect the acoustic signal at the listening positions 11 and 12, to generate an electric signal which is a measure of the acoustic signal at these positions, and to apply said electric signal to first and second inputs 14 and 15 of the control unit 13.

The detection means 11, 12 may be constructed in such a way that at each listening position one microphone is arranged as is shown in FIG. 1 of the aforementioned European Patent Application No. 165,733. Another possibility is that the detection means 11, 12 comprise two microphones for each listening position, which microphones are for example arranged in an artificial head, as is shown in FIG. 9 of European Patent Application No. 165,733. Yet another possibility is that the detection means 11, 12 comprise only one microphone—or only one set of two microphones (for example, again arranged in an artificial head). During the steps (a) and (c) of the method the detection means are then situated at the listening position $P_1$ and during step (b) of the method the detection means are then situated at the listening position $P_2$.

The two listening positions $P_1$ and $P_2$ are situated roughly between the two transducer devices 8 and 9, the distance between the first listening position $P_1$ and the first transducer device 8 being smaller than the distance between the second listening position $P_2$ and the first transducer device 8. Conversely, the distance between the second listening position $P_2$ and the second transducer device 9 is smaller than the distance between the first listening position $P_1$ and the second transducer device 9.

The equalizer 3 comprises two filters 16 and 17 whose frequency-response characteristics can be adjusted by means of two control signals $S_1$ and $S_2$ respectively, which are generated by the control unit 13 and applied to the filters 16 and 17 respectively. The filters 16 and 17 are respectively arranged between the terminals 5, 5' and 6,6' of the equalizing unit 2. The equalizer 4 also comprises two filters 18 and 19, whose frequency-response characteristic can be adjusted by means of two control signals $S_3$ and $S_4$, generated by the control unit 13 and applied to the filters 18 and 19 respectively. The filters 18 and 19 are respectively arranged between the terminals 5, 5' and 7, 7' of the equalizing unit 2.

It is assumed that not only the frequency-response characteristics of the filters 8 and 16 to 18 can be varied by means of the control signals $S_1$ to $S_4$ but that it is also possible to adjust a frequency-independent gain factor in each of the filters by means of these control signals. The control unit 13 further comprises a volume control 20 and a balance control 21 by means of which the balance between the left-hand and the right-hand signal components of the stereo signal can be set. The volume control is intended for adjusting a specific frequency-independent gain factor for all the four filters 16 to 19. This means that by means of the volume control 20 an overall increase or, conversely, reduction in the level of the signals applied to the two transducer devices 8 and 9 is obtained. By means of the balance control 21 the frequency-independent gain factors in the filters 16 and 18 can be varied relative to those in the filters 17 and 19. This means that by actuation of the balance control 21 the level of the signals applied to the transducers 8L and 9L can be varied relative to the level of the signals applied to the transducers 8R and 9R.

Figure 2:
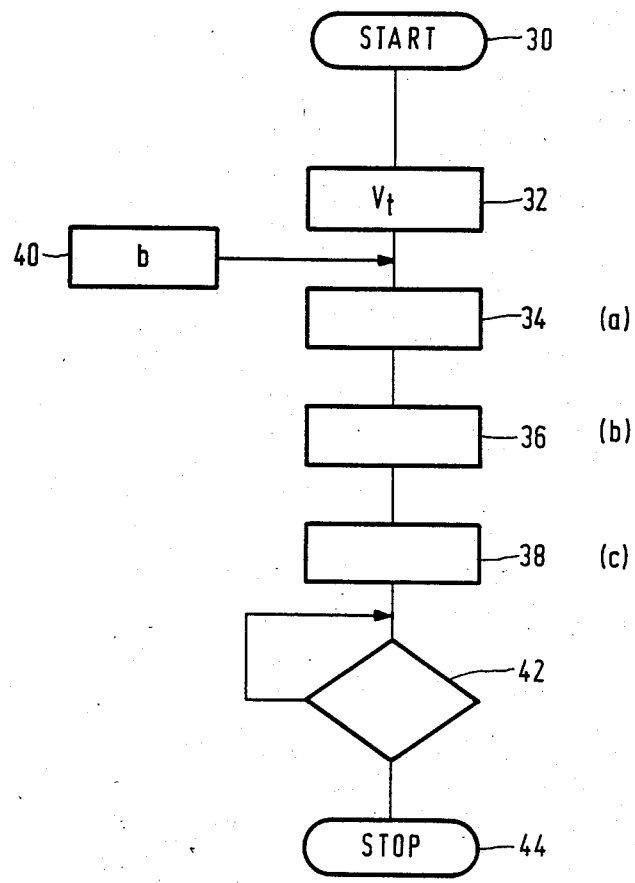
FIG. 2 is a flow chart of the method.

The operation of the arrangement shown in Figure 1 will now be described with reference to the flow chart of FIG. 2. When the arrangement is switched on the program is started in block 30.

Subsequently, the user of the arrangement sets the volume control 20 in such a way that the acoustic signals at the location of the two listening positions $P_1$ and $P_2$ roughly have a desired level: block 32. Subsequently, step (a) of the method is carried out in block 34. This means that the levels of the electric signals applied to the first and the second transducer device 8 and 9 are adjusted in such a way that the acoustic signals delivered by the first and the second transducer device provide substantially equal contributions to the acoustic signal at the location of the first listening position $P_1$. For the invention it is irrelevant how the levels are detected. It is possible, for example, to take the RMS value of the output signal of the detection means 10 for this level. The transducer device 9 is first switched off, so that the control unit 13 can determine the level $N_1$ of the contribution of the transducer device 8 to the acoustic signal at the listening position $P_1$ Subsequently, the transducer device 8 is switched off and the transducer device 9 is switched on. The control unit 13 now determines the level $N_2$ of the contribution of the transducer device 9 to the acoustic signal at the listening position $P_1$.

Subsequently, the (frequency-independent) gain factors in at least one of the two equalizers are varied in such a way that the contributions of the two transducer devices to the acoustic signal at the listening position $P_1$ are equal. Correction can be effected in various ways. Two of these methods will be discussed.

It is assumed that $N_1$ is greater than $N_2$.

A first possibility is that the gain factors in the filters 16 and 17 are reduced, whilst the gain factors in the filters 18 and 19 are increased until the contributions of the two transducer devices are equal to each other and have a value between $N_1$ and $N_2$, for example $(N_1+N_2)/2$. The disadvantage of this is that the level at the second listening position $P_2$ is raised and may become inconveniently high for a listener at said listening position $P_2$.

A second possibility, which does not have this drawback, is that only the gain factors in the filters 16 and 17 are reduced until the contribution of the transducer device 8 to the acoustic signal at the listening position $P_1$ is equal to $N_2$.

As a result of the level control in step (a) the acoustic signal at the listening position $P_2$ is mainly dictated by the acoustic signal delivered by the transducer device 9. Therefore, in step (b), block 36 in FIG. 2, the transmission from the input terminal 1-1' to the listening position $P_2$ is equalized. For this purpose the control unit 13 generates control signals $S_3$ and $S_4$, starting from the signals obtained from the detection means 12, so that the filter characteristic of the filters 18 and 19 is adjusted to obtain a substantially flat frequency-response characteristic for the transmission between the electric signal at the input terminal 1-1' and the acoustic signal at the second listening position $P_2$.

The equalizing method is also irrelevant to the invention. For example, European Patent Application No. 165,733 described a few ways of realizing equalization for one listening position. The detection means 12 may comprise one or two microphones. Further, equalization can be effected using an auxiliary signal, for example white or pink noise. The control unit 13 then also comprises an auxiliary-signal source for supplying white or pink noise to the inputs of the filters 18 and 19. Another possibility is that equalization is effected using the desired signals reproduced by the arrangement. Such an equalizing method is described, for example, in the Applicant's published European Patent Application No. 119,645 (PHN 10.592). In that case a signal supply line from the input terminal 1-1' to the control unit 13 is needed.

Control may be simplified by adjusting the two filters 16 and 17 to the same characteristic. This means that for adjusting these filters only one control signal is derived by the control unit 13 and is applied to both filters 16 and 17.

Subsequently, in step (c), block 38 in FIG. 2, the transmission from the input terminal 1-1' to the listening position $P_1$ is equalized. For this purpose the control unit 13 derives control signals $S_1$ and $S_2$ from the signals received from the detection means 11, by means of which control signals the filter characteristics of the filters 16 and 17 is adjusted so as to obtain a substantially flat frequency response characteristic for the transmission of the electric signal at the input terminal 1-1' to the acoustic signal at the first listening position $P_1$. During this equalization the second transducer device 9 must remain operative.

The method of equalizing in step (c) is the same as that applied in step (b).

Steps (a), (b) and (c) have now been carried out and the transmission to two positions $P_1$ and $P_2$ in the space 10 is now equalized. If the method is applied only once, the program proceeds directly from block 38 to block 44 and the program has ended.

It is also possible to repeat the program, for example if the user adjusts the balance control 21. This may mean that the transmission characteristics between the input terminal and the two listening positions are no longer flat. The control unit 13 detects the balance control 21 has been adjusted. The program now jumps to block 40, after which the steps (a), (b) and (c) are repeated for another balance setting.

Preferably, step (b) is repeated at least once while the first transducer device is operative. By thus repeating the method one or several times an iterative process is obtained, which results in an optimum setting (equalization) of the transmission characteristics to the two listening positions.

The program is terminated via block 42, for example in that the control system is switch off by actuation of a button.

Alternatively, equalization may be repeated automatically after a certain time interval.

Equalization of a frequency-response characteristic may mean that in fact only the amplitude characteristic (i.e. the amplitude of the transmission as a function of the frequency) is equalized. This means that the amplitude of the total transmission, including the equalizing filter, is substantially constant, i.e. frequency-independent.

However, it is also possible to equalize both the amplitude-versus-frequency and the phase-versus-frequency response characteristics.

Figure 3:
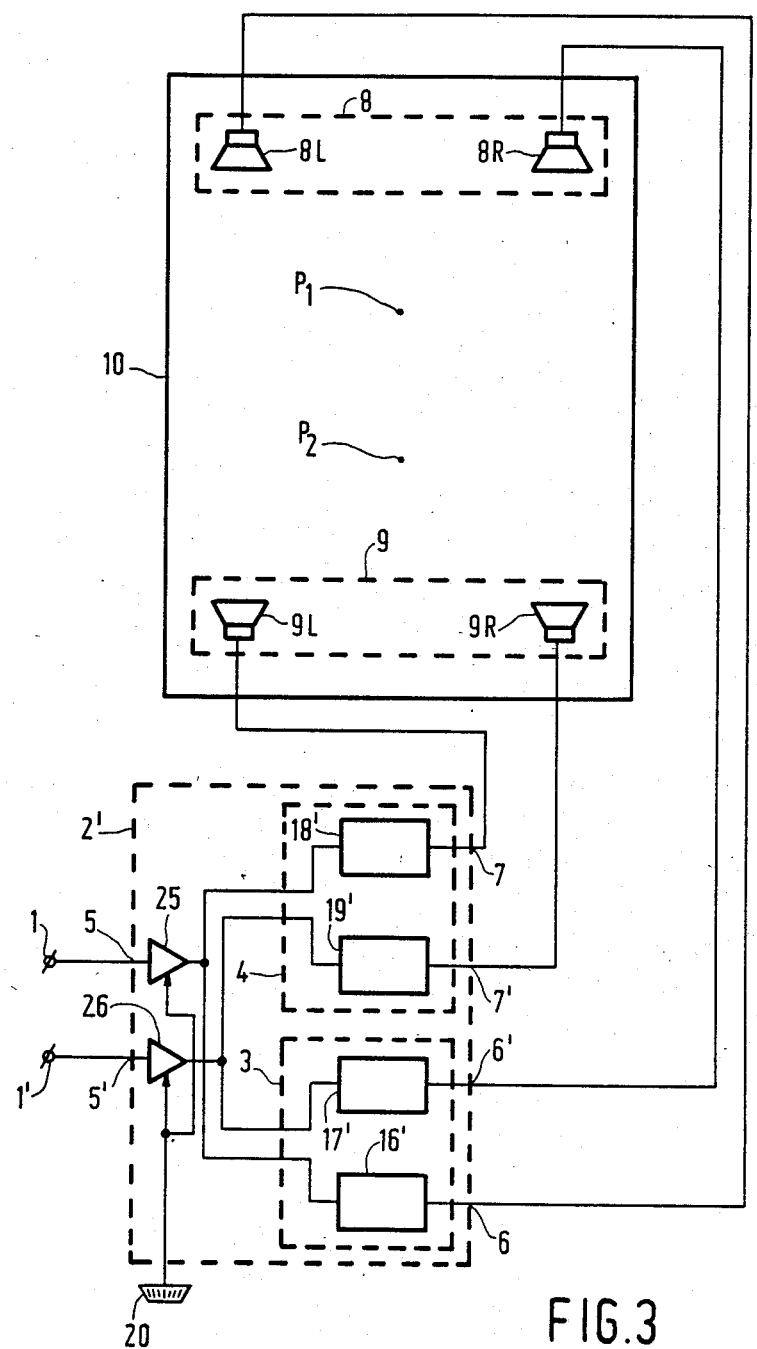
FIG. 3 shows an arrangement for amplifying an electric signal, comprising a first and a second filter unit adjusted in response to the measurement results obtained in accordance with the method.

FIG. 3 shows an embodiment of an arrangement 2' for amplifying an electric signal, for example a stereo signal in a space, for example the passenger compartment of a car. The results of the equalization methods as described with reference to FIGS. 1 and 2 may be used for adjusting four filters 16' to 19' in the two filter units 3 and 4 of the device 2' so as to obtain substantially flat frequency-response characteristics for the transmissions between the electric signal at the input terminal 1-1' and the acoustic signal at the first listening position P and between said electric signal and the acoustic signal at the second listening position $P_2$. The filters 16' to 19' are then fixed filters. However, it remains possible of course to adjust the overall level (independently of the frequency) by means of a volume control 20. This is achieved in that the gain factors of amplifiers 25 and 26 preceding the filters 16' to 19' can be varied by means of the volume control 20.

If desired, it is obviously also possible to adjust the front-rear balance as well as the left-right balance by means of associated controls (not shown). The left-right balance can be adjusted for example by driving the amplifiers 25 and 26 in FIG. 3 with different control signals.

Figure 4:
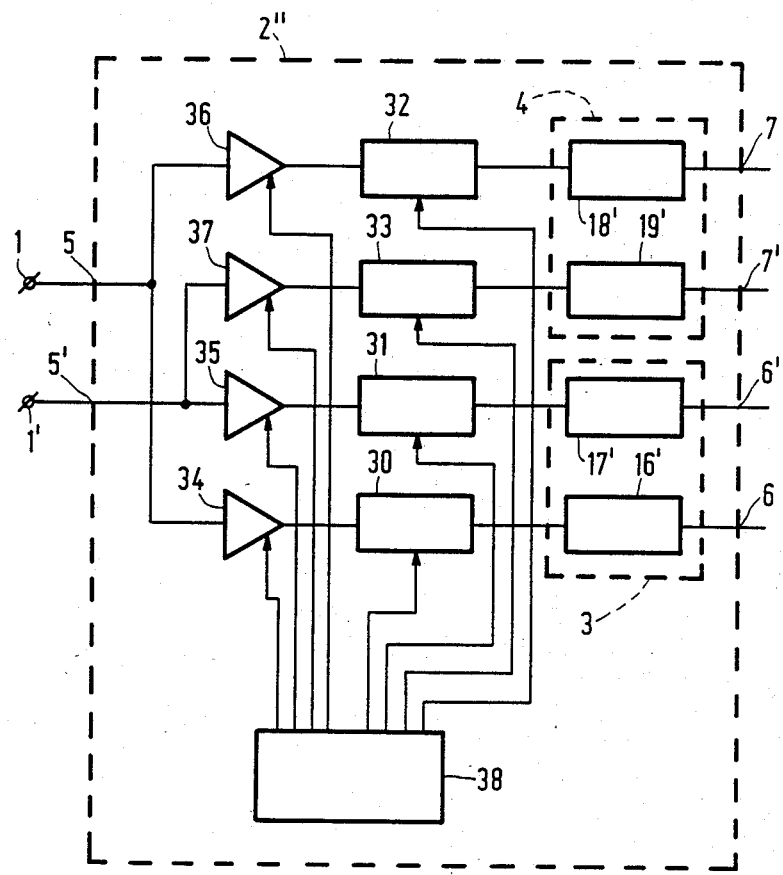
FIG. 4 shows another arrangement for amplifying an electric signal.

In general, an arrangement for amplifying an electric signal may be of a type as shown in FIG. 4.

The fixed filters 16' to 19' are preceded by variable filters 30 to 33. Further, variable amplifiers 34 to 37 are arranged before the filters 16' to 19'. The amplifiers and the variable filters can be adjusted by means of control signals generated by means of a control unit 38. The control unit 38 comprises controls (not shown) which can be actuated by a user for manually adjusting the front-rear balance, the left-right balance and, if desired, the frequency-response characteristic.

A change in frequency-response characteristic means that the filters 30 to 33 are adjusted to provide another filter characteristic.

However, the arrangement shown in FIG. 4 comprises fixed filters 16' to 19' such that if the setting, of the front-rear balance, the left-right balance and the frequency-response characteristics of the filters 30 to 33 is neutral, the frequency response characteristics of the transmission from the input terminal 1-1' to the first and the second listening positions $P_1$ and $P_2$ respectively, are substantially flat. It is obvious that the filters 18' and 32 may be combined to form a single (variable) filter. Of course, this also applies to the filters 19' and 33, 17' and 31, and 16' and 30.

So far the description only relates to the equalization of two frequency-response characteristics for the transmission to the two listening positions. However, as already stated, the scope of the invention is not limited thereto. In general, the invention is applicable to a method and arrangement for adjusting the transmission to the two listening positions so as to obtain a desired characteristic.

Figure 5:
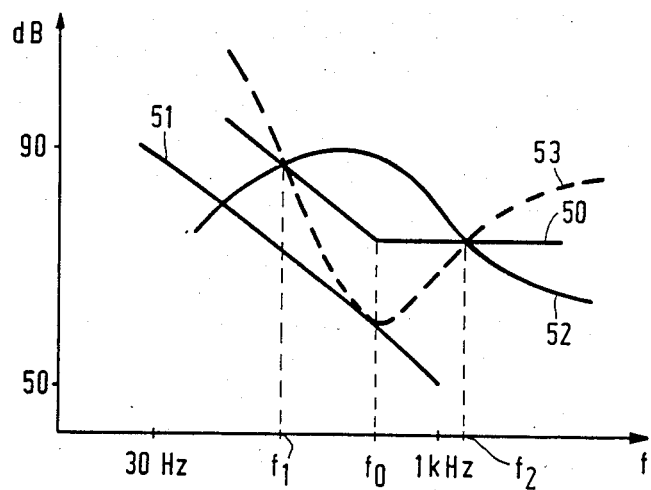
FIG. 5 shows a number of frequency-response characteristics.

In FIG. 5 such a desired characteristic as a function of the frequency is illustrated by means of the curve 50. Above a specific frequency 70 this curve is flat, i.e.

frequency-independent. For frequencies below $f_0$ the curve rises towards lower frequencies. The reason why such a curve is desired is as follows. The curve 51 in FIG. 5 represents the main noise component of the background noise in a car compartment. If for frequencies below $f_0$ the curve 50 would have been flat, the desired sound radiated by the transducer devices for frequencies lower than $f_1$ would have become (substantially) inaudible on account of the background noise. Therefore, an additional increase in gain is needed for frequencies below $f_0$, so that the desired sound level is situated sufficiently far above the background noise level, and the desired sound is still audible over the background noise.

The transmission is now adjusted as follows. By means of the detection device the control unit determines the actual transmission from the input terminal to a listening position. This transmission is represented, for example, by the curve 52.

In order to obtain a transmission in conformity with the curve 50 the transmission in the frequency range below $f_1$ must be raised, that in the frequency range between $f_1$ and $f_2$ must be reduced, and that in the frequency range $f_2$ must be raised again. This is achieved by adjusting the transmission characteristic of the filter unit in conformity with the curve 53 in FIG. 5.

The two desired transmission characteristics may both be in conformity with the curve 50 in FIG. 5.

It is also possible that the transmission characteristics have the same shape but differ in amplitude. For example, the other transmission characteristic may be a few dB higher than the curve 50 in FIG. 5.

What is claimed is:

1. A method of adjusting the frequency-response characteristic of the transmission of an electric signal which is applied to an input terminal of an amplifier unit and which is converted to an acoustic signal at least one listening position in a space via two electro-acoustic transducer devices, the electric signal being applied, via the input terminal, to a first and a second filter unit belonging to the amplifier unit and having an output coupled to the first and the second transducer device respectively, characterized in that for adjusting the frequency-response characteristics of the transmission of the electric signal, applied to the input terminal, to an acoustic signal at at least two non-coincident listening positions in the space, said two non-coincident listening positions being separated by a distance sufficient to allow at least one person to occupy one of said non-coincident positions and to allow at least a second person to occupy the other of said non-coincident positions:

(a) the levels of the electric signals applied to the first and the second transducer device are adjusted in such way that the acoustic signals delivered by the first and the second transducer device provide substantially equal contributions to the acoustic signal at the location of the first listening position;

(b) the second filter unit is adjusted so as to obtain a desired frequency-response characteristic for the transmission of the electric signal, applied to the input terminal, to the acoustic signal at the second listening position;

(c) the first filter unit is adjusted in such a way that in the presence of an electric signal applied to the second transducer device a desired frequency-response characteristic is obtained for the transmission of the electric signal, applied to the input terminal, to the acoustic signal at the first listening position, in that the first and the second listening position are situated at least substantially between the first and the second transducer device in the space.

2. A method as claimed in claim 1, characterized in the steps (b) and (c) the second filter unit and the first filter unit, respectively are adjusted so as to obtain a substantially flat frequency-response curve for the transmission of the electric signal, applied to the input terminal, to the acoustic signal at the second and the first listening position, respectively.

3. A method as claimed in claim 1 or 2, for adjusting the frequency-response characteristic of a transmission of the electric signal, applied to the input terminal, to an acoustic signal at a listening position in a car compartment, characterized in that one listening position is a front position and the other listening position is a rear position in the car compartment.

4. A method as claimed in claim 3, characterized in that the first listening position is the front position in the car compartment.

5. A method as claimed in claim 1, characterized in that in step (a) the level of the electric signal which, via the associated transducer device, provides the larger contribution to the acoustic signal at the location of the first listening position is reduced until the contributions to the acoustic signal at the first listening position provided by the acoustic signals delivered by the first and the second transducer device are substantially equal to one another.

6. A method as claimed in claim 1, characterized in that the steps (a), (b) and (c) are repeated at least once.

7. A method as claimed in claim 6, characterized in that step (b) is carried out in the presence of an electric signal applied to the first transducer device.

8. An arrangement for adjusting the amplification level and frequency response of two electric transmission paths, comprising an input terminal for receiving an electric signal;

an amplifier unit having an input coupled to the input terminal, a first and a second output, a first and a second filter unit coupled between the input and the first and the second output respectively, and a control-signal input for receiving a control signal;

a first and a second transducer device respectively coupled to the first and the second output of the amplifier unit for producing first and second acoustic signals, respectively;

detection means for detecting an acoustic signal at first and second listening positions in space that are separated by a distance sufficient to allow at least one person to occupy the first listening position and to allow at least a second person to occupy the second position, for generating an electric signal which is a measure of the acoustic signal detected at said first and second listening positions and for applying said electric signal to an output;

a control unit comprising a frequency-analyzer unit, having an input coupled to the output of the detection means, and an output for supplying the control signal, which output is coupled to the control-signal input of the amplifier unit said control unit further comprising:

(a) means to adjust the levels of the electric signals applied to the first and the second transducer devices by the amplifier unit in such a way that the acoustic signals delivered by the first and the second transducer devices provide substantially equal contributions to the acoustic signal at the location of the first listening position and detected by the detection means;

(b) means to adjust the second filter unit, after the levels of the electric signals to the first and second transducer devices have been adjusted, so as to obtain a desired frequency-response characteristic for the transmission of the electric signal, applied to the input terminal, to the acoustic signal detected by the detection means at the second listening position; and (c) means to adjust the first filter unit, after the second filter unit has been adjusted and while the second transducer device is operative, so as to obtain a desired frequency-response characteristic for the transmission of the electric signal applied to the input terminal, to the acoustic signal detected by the detection means at the first listening position.

9. An arrangement as claimed in claim 8, characterized in that the control unit is adapted to adjust the first and the second filter unit so as to obtain a substantially flat frequency-response curve for the transmission of the electric signal, applied to the input terminal, to the acoustic signal detected by the detection means at the first and the second listening position respectively.

10. An arrangement as claimed in claim 8, characterized in that the control unit is adapted to reduce (a) the level of that electric signal of the two signals applied to the two transducer devices which provides the larger contribution to the acoustic signal at the location of the first listening position and detected by the detection means, to a level at which the acoustic signals delivered by the first and the second transducer device provide equal contributions to the acoustic signal at the location of the first listening position and detected by the detection means.

11. An arrangement as claimed in claim 8, characterized in that the control unit is adapted to repeat operation of means (a), (b) and (c) at least once.

12. A method of adjusting the frequency-response characteristic of the transmission of an electric signal which is applied to an input terminal of an amplifier unit and which is converted to an acoustic signal at at least one listening position in a space via two electro-acoustic transducer devices, the electric signal being applied, via the input terminal, to a first and a second filter unit belonging to the amplifier unit and having an output coupled to the first and the second transducer device respectively, characterized in that for adjusting the frequency-response characteristics of the transmission of the electric signal, applied to the input terminal, to an acoustic signal at at least first and second non-coincident listening positions in the space, said two non-coincident listening positions being separated by a distance sufficient to allow at least one person to occupy said first non-coincident position and to allow at least a second person to occupy said second non-coincident position, the first and the second listening position being situated at least substantially between the first and the second transducer device in the space, and the distance between the first transducer device and the first listening position being smaller than the distance between the first transducer device and the second listening position, and vice versa:

(a) the levels of the electric signals applied to the first and the second transducer device are adjusted in such way that the acoustic signals delivered by the first and the second transducer device provide substantially equal contributions to the acoustic signal at the location of the first listening position and substantially unequal contributions at the location of the second listening position, because of the relative locations of the transducer devices and the listening positions, with the sound level at the second listening position being mainly determined by the acoustic signal delivered from the second transducer device.

(b) after the adjustment (step a) of the levels of the electric signals, the second filter unit is adjusted so as to obtain a desired frequency-response characteristic for the acoustic signal at the second listening position;

(c) after the adjustment (step b) of the second filter unit, the first filter unit is adjusted in such a way that in the presence of an electric signal applied to the second transducer device a desired frequency-response characteristic is obtained for the acoustic signal at the first listening position.

* * * * *